(12) United States Patent
Ricker

(10) Patent No.: US 7,964,861 B2
(45) Date of Patent: Jun. 21, 2011

(54) METHOD AND APPARATUS FOR REDUCING PROGRAMMED VOLUME OF PHASE CHANGE MEMORY

(75) Inventor: Jim Ricker, Woodhaven, MI (US)

(73) Assignee: Ovonyx, Inc., Troy, MI (US)

( * ) Notice: Subject to any disclaimer, the term of this patent is extended or adjusted under 35 U.S.C. 154(b) by 603 days.

(21) Appl. No.: 11/983,026

(22) Filed: Nov. 6, 2007

(65) Prior Publication Data

US 2009/0114898 A1    May 7, 2009

(51) Int. Cl.
*H01L 45/00* (2006.01)
(52) U.S. Cl. .. 257/3; 257/2; 257/4; 257/5; 257/E45.002; 438/102

(58) Field of Classification Search ............... 257/2, 3, 257/4, 5, E45.002
See application file for complete search history.

(56) References Cited

U.S. PATENT DOCUMENTS

| | | | | |
|---|---|---|---|---|
| 2007/0097739 | A1* | 5/2007 | Happ et al. | 365/163 |
| 2007/0147109 | A1* | 6/2007 | Kim | 365/163 |
| 2008/0121862 | A1* | 5/2008 | Liu | 257/4 |
| 2009/0261316 | A1* | 10/2009 | Liu | 257/5 |

\* cited by examiner

*Primary Examiner* — Kenneth A Parker
*Assistant Examiner* — David Spalla
(74) *Attorney, Agent, or Firm* — Kevin L. Bray

(57) ABSTRACT

A phase change memory includes a volume of phase change material disposed between, and coupled to, two electrodes, with the composition of a region of at least one of the two electrodes or phase change material having been compositionally altered to reduce the programmed volume of the phase change material.

24 Claims, 6 Drawing Sheets

METHOD AND APPARATUS FOR REDUCING PROGRAMMED VOLUME OF PHASE CHANGE MEMORY

CROSS-REFERENCE TO RELATED APPLICATIONS

FIELD OF INVENTION

This invention pertains to phase change electronic devices, and, more particularly, to phase change electronic devices having a minimal programmed volume.

BACKGROUND OF THE INVENTION

Phase-change electronic devices include memory devices, referred to herein as Ovonic Universal Memory (OUM). OUM cells utilize a class of materials that are reversibly switchable from one material phase to another with measurable distinct electrical properties associated with each phase. For example, these materials may change between an amorphous disordered phase and a crystalline, or polycrystalline, ordered phase, with a significant corresponding change in the thermal and electrical conductivity of the material. Such materials may also exhibit many substrates, each with associated discernable differences in their electrical properties.

Chalcogenide materials are typically employed as the phase change material used in OUM cells. A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or crosslinking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process: a chalcogenide nitride, or oxide, for example and chalcogenide may be modified by an ion implantation or other process.

Early work in chalcogenide devices demonstrated electrical switching behavior in which switching from a resistive state to a conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds for over $10^{13}$ cycles. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference.

Another important application of chalcogenide materials is in electrical and optical memory devices. One type of chalcogenide memory device utilizes the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Intermediate sub-states corresponding to various degrees of amorphization (or crystallization), with corresponding discernable differences in electrical properties such as resistivity, may be used to increase the information density of each OUM cell. Each memory state of a chalcogenide memory material corresponds to a distinct resistance value and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774, 387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in IEEE Spectrum, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical chalcogenide materials.

The possibility of changing the phase of chalcogenic material from the amorphous to the crystalline state using electrical pulses is indeed not immediately apparent. In the amorphous state, the material resistivity is very high and the current flowing through the chalcogenic material would not allow a sufficient dissipation and thus a sufficiently high temperature. However, chalcogenic materials change their transport characteristics as a function of the applied electric field. Above a threshold voltage $V_{th}$, the structure begins to conduct, not because of a phase change, but because of a change in the electronic conduction mechanism. This behavior is called "electronic switching"; accordingly, biasing the chalcogenic structure to a voltage higher than the threshold voltage, it is possible to considerably increase the current flow. By directing this current through a suitable neighboring series resistor, which operates as a heater, it is thus possible to obtain, by Joule effect, a sufficient heating of the chalcogenic material for crystallization or amorphization.

For practical application, it is highly desirable that OUM cells be compatible with existing integrated circuit technologies, such as CMOS technology. In particular it would be highly advantageous for OUM cells to operate with the relatively limited current and withstand voltage values available from CMOS technology. For example, a CMOS technology that features a gate length of 130 nm and a gate oxide withstanding a power supply of 3 V, limit the maximum current that might be employed to switch an OUM cell to 100-200 μA. In order to achieve the necessary heating with such a limited current, the area in contact between the chalcogenic region and resistive electrode must be restricted to an area smaller than may be produced using conventional lithographic techniques. Several attempts have been made to achieve such reduction of chalcogenide regions.

The sectional views of FIGS. 1A through 1C will be used to discuss broad conceptual aspects of a phase-change electronics device in accordance with the principles of the present invention. FIG. 1A depicts a conventional volume of phase change material of length L, depth D, and height H. Typically, whether employed as an element within an OUM or OTS, the volume of phase change material (e.g. L×D×H) used in electronics devices has been produced in a manner that yields uniform electrical characteristics throughout the volume. Such uniformity is generally considered essential to proper and consistent operation of the millions of devices that may be co-located on a single chip, or wafer of electronics devices, that incorporate phase change volumes such as that of FIG. 1A.

One of the characteristics of the phase change that is typically uniform throughout the volume is its propensity for switching. By propensity for switching, or relative "activeness," we mean, in the case of chalcogenide material used in an OUM, for example, the relative ease with which, when exposed to a voltage pulse, the chalcogenide material will be placed in the crystalline or amorphous state (or intermediate state), depending upon the magnitude and duration of the pulse. Without such uniformity; one device within an array might switch states at a much different level than another within an array; one array within an integrated circuit might switch at a much different level than other arrays within the integrated circuit; one integrated circuit might switch at a much different level than other integrated circuits within a wafer. Uniform switching of the devices and uniform switching characteristics of the materials are highly desirable characteristics. In the conventional phase change block of FIG. 1A, the composition of the phase change material and propensity for switching are substantially uniform throughout the volume L×H×D.

In order to reduce the current required to operate such a volume, a great deal of effort has been expended in reducing the volume of phase change material used in electronic devices: reduce the phase change material, reduce the amount of phase change material that must be heated. In FIG. 1B the dimensions L and D are reduced to the minimum feature size afforded by the device's associated manufacturing process, also referred to as the lithographic limit (e.g. $L_{Lith}$ in FIG. 1B). Once minimum feature size limitations are encountered, other techniques that reduce the phase change material volume to less than that achievable by lithographic techniques may be employed. One example of such sublithographic approaches is the introduction of sidewall spacers within a phase change material pore, illustrated in FIG. 1C. With sidewalls 102 of a pore 100 formed at the lithographic limit, $L_{lith}$, the volume of phase change material 106 within the pore would simply be the volume of the cylinder of height H and diameter $L_{Lith}$. Introduction of the sidewall spacers 104, which typically are composed of an insulating material, reduces the volume of phase change material within the pore by an amount equal to the volume of the sidewall spacers.

Another approach to reducing the current required to effect a phase change in the phase change material of a phase change electronics device, an approach that goes beyond volume reduction barriers imposed by lithographic limits, is to reduce the volume of phase change material that actually undergoes a phase change. That is, although a phase change device cell may include a volume L×H×D of phase change material, the volume of phase change material that actually undergoes a phase change may be only a fraction of that volume. By reducing this portion of the phase change material, referred to herein as the programmed volume, further reductions of operating current, may be achieved. To that end, resistive heaters 200 such as that shown in FIG. 2 have been employed to heat a localized area of phase change material 202 to reduce the programmed volume 204 of phase change material and thereby further reduce the current required for operation of a phase change device 206.

The introduction of a breakdown layer is meant to achieve a similar reduction in programmed volume by localizing current flow. Such approaches may involve the introduction of one or more additional layers to a phase change electronics device, with associated escalation in expense and, as with many increases in complexity, the potential for reduced reliability. For example, in order to form a current filament and thereby reduce the volume of phase change material that must undergo a phase change, some designs (including U.S. Pat. Nos. 6,992,369; 7,029,978; and 7,105,408, hereby incorporated by reference) introduce a "breakdown layer" between an electrode and the chalcogenide material and at least one (U.S. Pat. No. 7,029,978) requires supplemental processing in addition to that normally associated with the addition of a layer of material. In order to accommodate the limitations of existing integrated circuit technology, the ability to produce smaller operational features in phase change materials, as well as associated devices, such as Joule heating devices, would therefore be highly desirable.

SUMMARY OF THE INVENTION

A phase change memory in accordance with the principles of the present invention includes a volume of phase change material disposed between, and coupled to, two electrodes, with the composition of a region of at least one of the two electrodes or phase change material having been compositionally altered to reduce the programmed volume of the phase change material. The device may also include a heater device and, in such an embodiment, the heater device may be similarly modified. In illustrative embodiments, the structural alteration(s) may: make a portion of the phase change material more or less active (that is, more or less likely to switch), restrict current flow to a specific region of the phase change material, or provide additional insulation for the phase change material's programmed volume. Any one or any combination of these effects may be employed to reduce the current required to effect a detectable state change within the phase change material.

A method and apparatus for making a new phase change cell in accordance with the principles of the present invention structurally alters the composition of a region of phase change material or associated electrode material to thereby reduce the programmed volume of the resultant phase change cell. By altering the composition(s), a cell in accordance with the principles of the present invention may require significantly less operating current than a comparable conventional cell (i.e. a cell having the same volume of phase change material, same basic phase change material, same layout). Such compositional alterations may be performed at various steps in the production of a phase change memory.

In an illustrative embodiment a system and method in accordance with the principles of the present invention employ a shadowed angled implantation or directional sputtering process to modify one or more regions within a phase change memory to alter the switching characteristics of a portion of the phase change material. Such modification of the switching characteristics may reduce the programmed volume of the cell, restrict the flow of current within the cell, or provide additional thermal insulation for the programmed volume. In addition to or in substitution for such modification of the composition of a portion of the phase change material, a similar process may be employed to modify the composition of a portion of one or more electrodes or, in a cell that includes a Joule heater, a portion of the Joule heater.

In a device that includes a Joule-heating device (also referred to herein as a heater), although the area of the heater in contact with (or in close proximity to) the phase change material is the dimensional value of interest, the end-effect is to reduce the volume of phase change material made to change phase. Consequently, the term "programmed volume" may be used herein in reference to the dimensional reduction of both the affected volume of the phase change material and the contact area of an associated Joule heating device.

Various characteristics of the materials, such as thermal and electrical resistivity, may be manipulated in accordance with the principles of the present invention in order to produce regions within the materials that reduce a phase change device's programmed volume. In illustrative embodiments, such regions feature sublithographic dimensions. A circuit device upon which an implantation step in accordance with the principles of the present invention is carried out includes a layer of phase change material which may, for example, be a unitary layer of material or may be composed of sub-layers combined to yield desirable bulk properties. The phase change material may be located, for example, within a pore formed in a dielectric material, for example. One or more angled implant regions may be formed within the device of interest (for example, OUM, electrode, or Joule heating device) using a shadowing technique.

The shadowing structure used to create the illustrative implant regions may be a permanent part of the device or it may be a temporary structure that is removed during a manufacturing step subsequent to the angled implantation step. Various implantation shapes and sizes may be formed in a circuit device through use of shadowing structures having different shapes and sizes. The use of different implantation angles, including vertical shifts and lateral rotations, in combination with shadowing structures of different shapes and sizes, enables the production of devices in accordance with the principles of the present invention that feature a wide variety of implantation regions, all of which may be used to reduce the programmed volume of phase change devices.

When multiple regions are implanted within a phase change device, the implanted regions need not be symmetrical. For example, implanting one region within a circuit device from a first angle may be accomplished with a shadowing structure of a first height and another region within the circuit device may be implanted using a shadowing structure of a different height. Assuming the implantation beam is at the same angle with the horizontal in both implantations, the different heights of the shadowing structures will yield different implantation profiles for different regions.

The use of different implantation materials allows for the positive or negative manipulation of characteristics of a region of interest. Compositionally modified phase change material may be rendered more or less active, that is, more or less likely to switch states for a given energy input, depending upon the type of implantation. In a chalcogenide phase change device, for example, implanting oxygen, silicon, arsenic, phosphorous, or nitrogen will decrease the material's propensity for crystallization, even to the point of "inactivating" the material and rendering it a high-resistance amorphous material. The implantation of other materials, such as tellurium, will render chalcogenide more likely to crystallize. Implantation for positive (those that tend to activate) and negative (those that tend to inactivate) effects and for combinations thereof is within the scope of a method and apparatus in accordance with the principles of the present invention.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, and electrical changes may be made without departing from the spirit or scope of the invention.

The term "substrate" used in the following description may include any supporting structure including, but not limited to, a semiconductor substrate that has an exposed substrate surface. The term semiconductor substrate may include, for example, silicon on insulator (SOI), silicon on sapphire (SOS), doped and undoped semiconductors, epitaxial layers of silicon supported by a base semiconductor foundation, and other semiconductor structures. When reference is made to substrate, semiconductor substrate, or wafer in the following description, previous process steps may have been used to form regions, junctions, and complex structures, including but not limited to a microprocessor or microcontroller, for example, in or over the base semiconductor or foundation. The substrate need not be semiconductor-based, but may be any support structure suitable for supporting an integrated circuit, including, but not limited to, metals, alloys, glasses, polymers, ceramics, and other supportive materials as is known in the art. The term "chalcogenide glass," or simply chalcogenide, is intended to include substances that comprise at least one device from group VIA (or group 16) of the periodic table. Group VIA elements (e.g., O, S, Se, Te, and Po) are also referred to as chalcogens. For the sake of brevity and clarity of description, reference will be made primarily to OUM devices in the following discussion. Accordingly, the scope of the invention is defined only by reference to the appended claims.

Figure 1A:
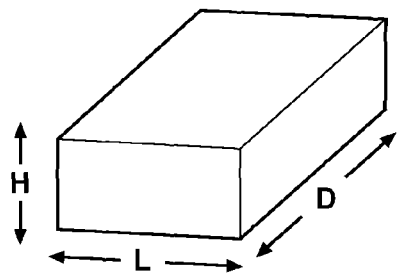
FIGS. 1A through 1C are conceptual diagrams of a volume of phase change material and an approach to reducing the volume of phase change material contained in a phase change memory.
Figure 1B:
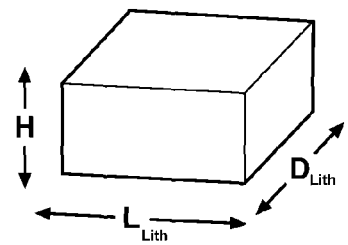
Figure 1C:
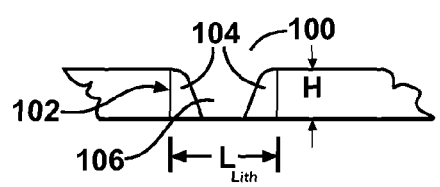
Figure 2:
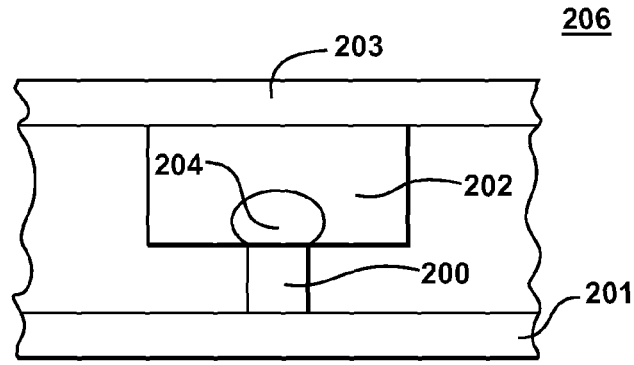
FIG. 2 is a diagram of a "mushroom" phase change memory configuration.
Figure 3:
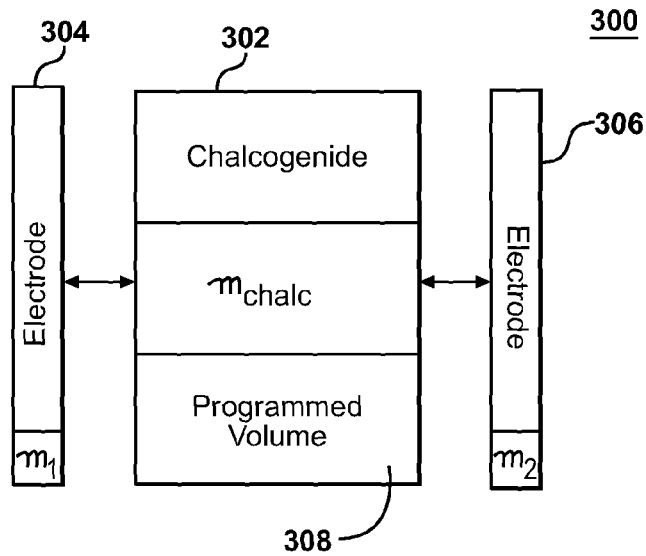
FIG. 3 is a conceptual block diagram of a phase change memory in accordance with the principles of the present invention.

The conceptual block diagram of FIG. 3 illustrates the basic components of a phase change electronics device 300 in accordance with the principles of the present invention. The device 300 includes a volume of phase change material 302 disposed between and electrically coupled to two electrodes 304, 306. In accordance with the principles of the present invention the composition of a region, respectively labeled $M_1$, $M_2$, $M_{chalc}$, of at least one of the electrodes or the phase change material has been compositionally modified to reduce the programmed volume 308 of the phase change material 302 employed by the device. By reducing the programmed volume 308 a device and method and apparatus for making the same in accordance with the principles of the present invention reduces the power and current requirements for a phase change electronics device. Such a reduction may be employed, for example, to improve the performance of a phase change electronics device even while using relaxed design rules in the production thereof. In the case of devices wherein the dimensions are already at the lithographic limit, the device yields sublithograhic features and corresponding reduction in current requirements.

Figure 4A:
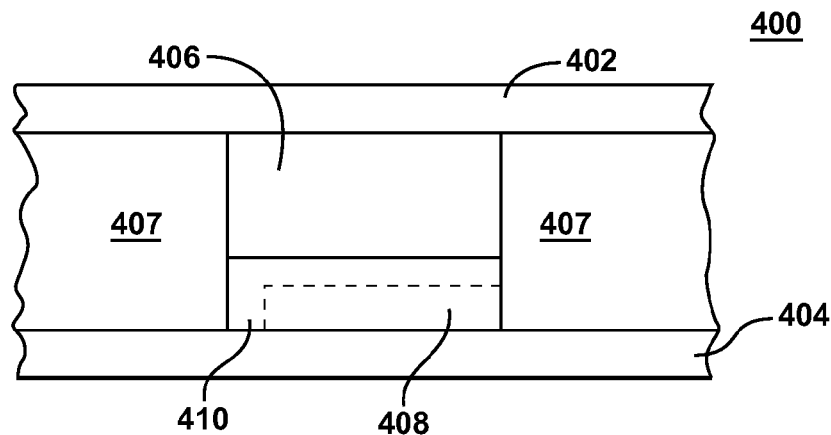
FIGS. 4A and 4B are conceptual diagrams illustrating the reduction of programmed volume within a phase change memory in accordance with the principles of the present invention.
Figure 4B:
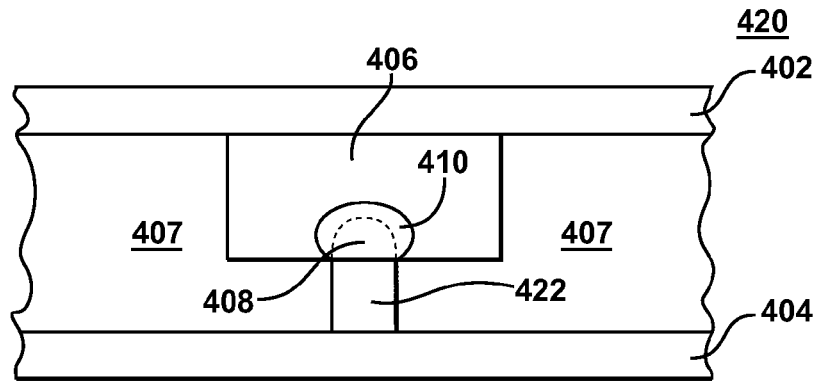

The side views of FIGS. 4A and 4B provide more detailed depictions of the reduction of programmed volume in phase change electronics devices in accordance with the principles of the present invention. In FIG. 4A a device 400 includes top and bottom electrodes 402, 404 (although not shown here, it will be apparent to those familiar with the art that the electrodes and phase change material may also be positioned side-by-side in a horizontal orientation), with phase change material 406 disposed therebetween and coupled to the electrodes. Insulating material 407, which may be $SiO_2$ for example, surrounds the phase change 406. In this illustrative embodiment the programmed volume 408 is reduced by an amount 410 through compositional modification of a portion of at least one of the electrodes 404, 402 or the phase change material 406. The device 420 of FIG. 4B includes a heater 422 in addition to the electrodes, 404,402 insulating material 407 and phase change material 406. The heater 422 may be composed of, Aluminum, Copper, or Titanium Nitride, for example. As indicated in this view, the programmed volume 408 of a device that employs a heater 422 is localized in proximity to the region of contact between the heater 422 and the phase change material 406. The reduction in programmed volume 410 may conform to the same profile as that of the non-reduced programmed volume, as indicated here, or a reduction in programmed volume in accordance with the principles of the present invention may also have the effect of altering the profile of the programmed volume.

Figure 5A:
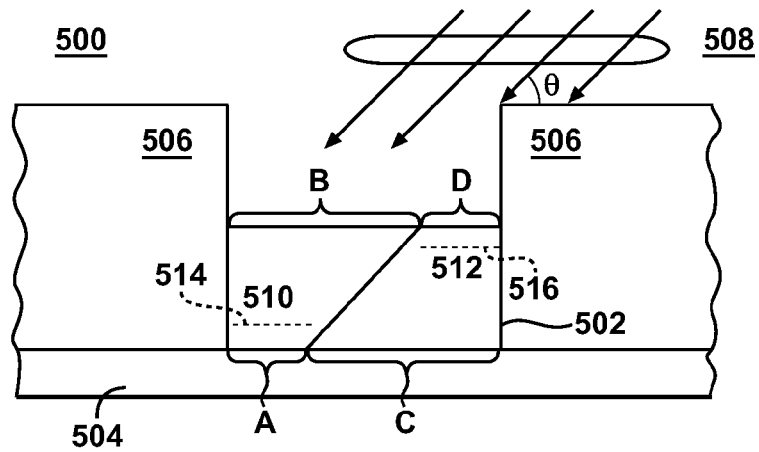
FIGS. 5A and 5B are cross sectional views of phase change memories in accordance with the principles of the present invention with programmed volumes reduced through angled implantation.

The sectional view of FIG. 5A provides a conceptual illustration of a phase change device 500 employing a system and method in accordance with the principles of the present invention. As previously described, the device 500, or parts thereof, may be employed in a wide variety of more complex electronics devices. Some such devices, including a memory array, a microprocessor with embedded memory, and a handheld electronics device are described in greater detail in the description related to the discussion of FIG. 9.

In this illustrative embodiment, a layer of phase change material 502 is disposed atop a bottom electrode 504. An insulator layer 506 acts as a shadowing structure for angled implantation. Other processes, such as directional sputtering, for example, may be employed in accordance with a process in accordance with the principles of the present invention. As previously mentioned, the shadowing structure, insulator layer 506 in this illustrative embodiment, maybe be an integral part of the final device of which the phase change material 502 is a part, or all or part of the shadowing structure may be removed after it has performed its shadowing function. The angled implantation is represented graphically by rays 508. As a result of the shadowed angled implantation, the phase change material 502 is divided into two regions: an implanted region 510 and a non-implanted region 512. As previously described, the implantation may be employed to increase a characteristic value of the implanted material, such as resistivity (positive implant), or to reduce a characteristic value of the implanted material such as resistivity (negative implant).

The phase change device 500, electrode 502, insulator layer 504, and implant stream 508 may be of any suitable material, such as is known in the art. The implant material 508 is delivered to the phase change device 500 at an angle θ to the horizontal, which is greater than 0° but less than 90°. In this illustrative embodiment, one, or both, of the implanted 510 and non-implanted 512 regions has at least one horizontal linear dimension that is sublithographic. That is, in this illustrative embodiment, at least one of the dimensions A, B, C, or D is of a length that lithographic techniques are incapable of defining. If the implantation material 508 is one that increases the resistivity of the phase change material 502, such as oxygen or nitrogen, for example, the implanted region 510 will be both thermally and electrically more insulating than the non-implanted region 512. Because both thermal and electrical conduction (and non-crystalline to crystalline transformations) are more likely to take place in the non-implanted region 512, the implanted region 510 is, effectively, eliminated from contributing to the programmed volume of phase change material. The reduction of the programmed volume achieved by bisecting the phase change region 502 and "deactivating" the region 510 is delineated by broken line 514.

By way of example, with proper alignment, in an embodiment that employs a Joule heating device, the familiar quasi-hemispherical programmed volume of phase change material would be reduced by the portion of the implanted region that slices through that volume. As a result, the volume of phase change material transformed in either a crystallization or amorphization step would be reduced a (potentially) significant amount and the heat and current required to effect those steps would also be reduced.

Figure 5B:
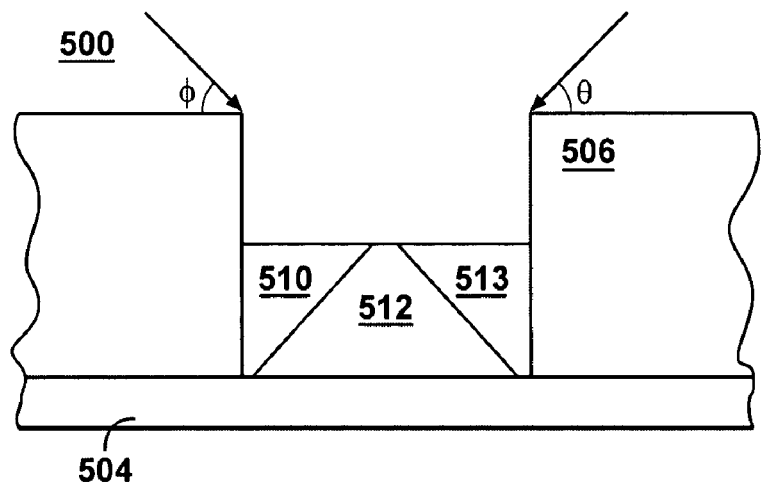

If implantation is carried out from opposite sides of the phase change device 500, as illustrated in FIG. 5B, an additional implanted region 513 is formed in the phase change layer 502. The implant material 516 is directed toward the phase change layer 502 at an angle Φ with the horizontal. This implantation angle Φ may be greater than 0° but less than 90° and, depending upon implementation, may be independent of the angle θ employed for the implantation 508.

In accordance with the principles of the present invention, multiple implantations may be performed simultaneously or sequentially. Various implantation shapes and sizes may be formed in a circuit device, such as phase change device 500, through use of shadowing structures such as structure 506, having different shapes and sizes. The use of different implantation angles, such as angles θ and Φ, including vertical shifts and lateral rotations, in combination with shadowing structures of different shapes and sizes, enables the production of devices in accordance with the principles of the present invention that feature a wide variety of implantation regions, all of which may be used to reduce the programmed volume of a phase change device such as that of device 500. When multiple implantations that render phase change material less active are employed, a path of active material may be maintained between the electrodes to ensure operability of the device.

Although each of the implantations in the illustrated embodiment of FIGS. 5A and 5B penetrate the entire phase change layer 502, this need not be the case. The implantation angle and height of the shadowing structure 506 may be selected so that, for example, the left edge of region 510 extends only part of the way down the edge of the wall formed by the intersection of the phase change layer 502 and the insulator 506. Additionally, although illustrative examples herein may depict the implantation as penetrating an entire layer of material, such as the layer of phase change material 502, the implantation process may, in accordance with the principles of the present invention, be stopped before the entire depth of the material is implanted. When multiple regions are implanted within a device of interest such as phase change layer 502, the implanted regions 510 and 514 need not be symmetrical. As previously noted, a structural alteration to the composition of a portion of a device in accordance with the principles of the present invention may be "positive" (i.e., more inclined towards crystallization) or "negative" (i.e. less inclined towards crystallization).

The top plan and perspective views of FIGS. 6A through 6H depict illustrative phase change structures that may be produced in accordance with the principles of the present invention. Although techniques in accordance with the principles of the present invention may be employed to produces device elements, programmed phase change volumes for example, which exhibit linear features equal to or greater than limits imposed by lithographic techniques, in the illustrative embodiments of FIGS. 6A through 6H at least one linear dimension of each of the depicted elements is less than that achievable through lithographic techniques. For ease of depiction, each of the figures illustrates the effects of a process in accordance with the principles of the present invention on a cylinder of phase change material such as may be used to fill a pore formed in an insulating layer, for example. However, the use of other phase change forms, such as rectilinear solids, for example, is within the scope of this invention.

Figure 6A:
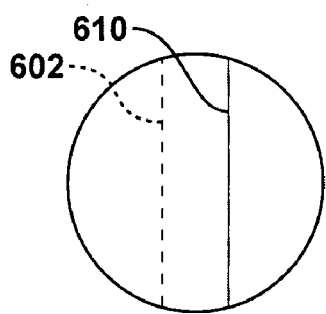
FIGS. 6A through 6H are illustrative embodiments of a phase change plug that has various implantations to reduce the programmed volume of a memory that employs such a plug.
Figure 6B:
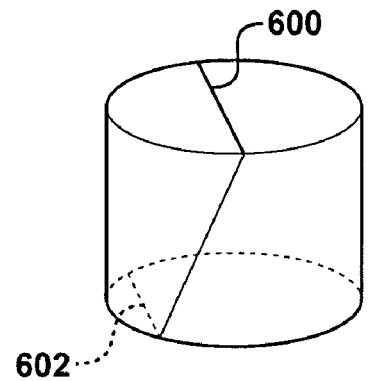

FIG. 6A is a top plan view of a cylindrical plug of phase change material that has been implanted in accordance with the principles of the present invention to reduce the programmed volume of the phase change material. In this view, a solid line 600 indicates a demarcation at the top of the phase change cylinder between the active (non-implanted) and non-active (implanted) regions of the phase change material. A broken line 602 indicates a demarcation at the bottom of the implant region, which may be at the bottom of the phase change cylinder, between the active (non-implanted) and non-active (implanted) regions of the phase change material. FIG. 6B is a perspective view of the implanted phase change plug of FIG. 6A that more clearly illustrates the angled plane that divides the implanted and non-implanted regions of the phase change plug depicted in FIG. 6A.

Figure 6C:
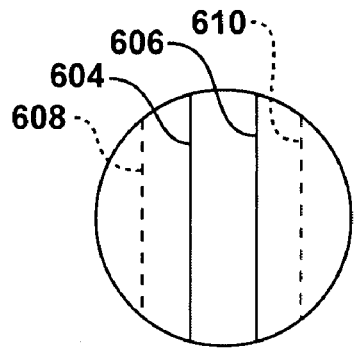
Figure 6D:
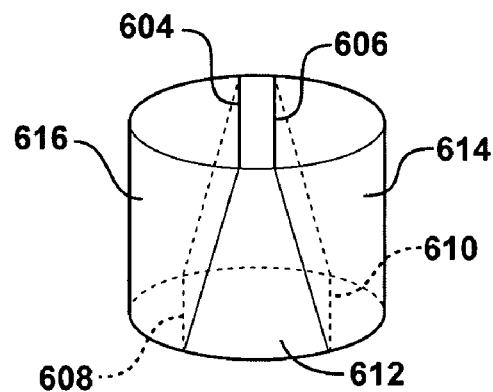
Figure 6E:
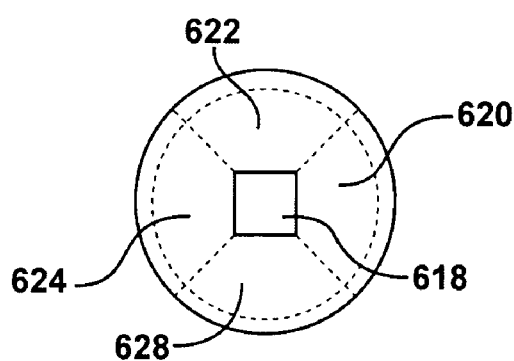
Figure 6F:
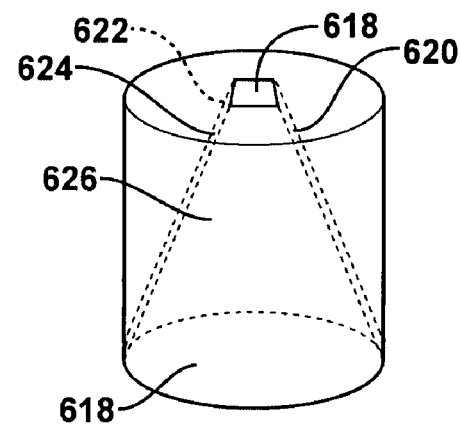
Figure 6G:
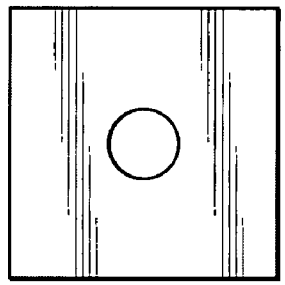
Figure 6H:
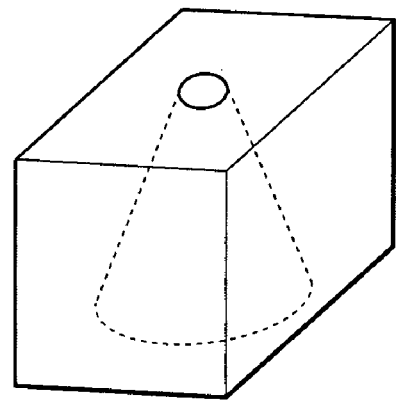

FIG. 6C is a top plan view of a double implant phase change plug in accordance with the principles of the present invention. Solid lines 604 and 606 indicate demarcations between a central, non-implanted region of phase change material and adjoining implanted regions. Broken lines 608 and 610 indicate a demarcation at the bottom of the implant region, which may be at the bottom of the phase change cylinder, between the active (non-implanted) and non-active (implanted) regions of the phase change material. As previously described, the two implants may be symmetrical or not, may employ the same implant material or not, may be performed simultaneously, and may affect the phase change characteristics in the same or opposite manner (i.e. activate or deactivate). The perspective view of FIG. 6D illustrates the resultant trapezoidal solid of non-implanted phase change material 612 bounded on two sides by implanted volumes 614 and 616. The top plan and perspective views of FIGS. 6E and 6F provide respective views of a phase change plug having a central tetrahedral non-implanted volume 618 surrounded by four angled implant regions 620, 622, 624, and 626. In this illustrative embodiment the four angled implant regions are produced by implanting, then rotating the wafer of which the phase change device is a part through 90°, implanting, and repeating until the four implant regions are created. As previously noted, shadowing structures may be of various heights, may be positioned closer to or further from the region to be implanted, and the implant angle may be varied, all of which provide a great deal of flexibility in producing implant regions of various shapes and sizes. Shawdowing structures may also be "offset" from the phase change material to implanted, thereby permitting the implantation of regions within the phase change material that, at the surface of a cylindrical device such as depicted in FIGS. 6A through 6H, form any variety of "slices" of the circular pie.

Figure 7A:
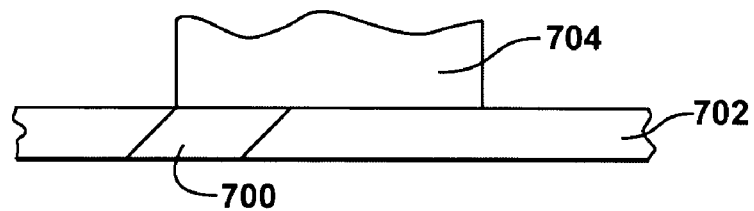
FIGS. 7A through 7C are illustrative embodiments of phase change memories having elements outside the phase change volume compositionally modified to reduce the programmed volume of the phase change material.

As previously described, in addition to the structural modification of the composition of a region of phase change material, a device in accordance with the principles of the present invention may include one or more compositionally modified regions in its associated electrodes or an associated heater. FIGS. 7A through 7 provide illustrative examples of some such modified regions. In FIG. 7A a region 700 of a bottom electrode 702 has been implanted to reduce the conductivity of implanted portion of the electrode. Such a reduction in conductivity may be employed to reduce the effective contact area of such an electrode and thereby increase the current density into a neighboring phase change material volume 704 to which the electrode is electrically coupled. So long as conductivity to the device is maintained, any variety of such implants may be used to reduce the contact area of an electrode 702.

Figure 7B:
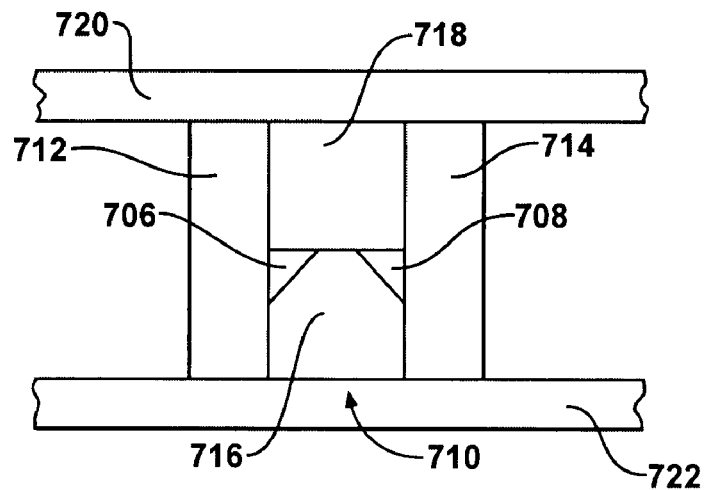

FIG. 7B illustrates an embodiment in which similar implant regions 706, 708 formed in a heater 710 such as may be employed in conjunction with a phase change electronics device such as an OUM. In this illustrative embodiment, insulating sidewall spacers 712, 714 act as the shadowing structures in a rotational implant such as described in the discussion related to FIG. 5 that yields, for example, a quasi-tetrahedral non-implanted region 716. With the addition of a phase change plug 718, a top electrode 720 and a bottom electrode 722 the basic device is complete. In this illustrative embodiment, because current will be concentrated in the top (reduced) area of the non-implanted region 716, the increased current density will provide additional heating intensity for the region of phase change material 718 proximate the reduced-area top, thereby reducing the total energy required to amorphize the phase change material.

Figure 7C:
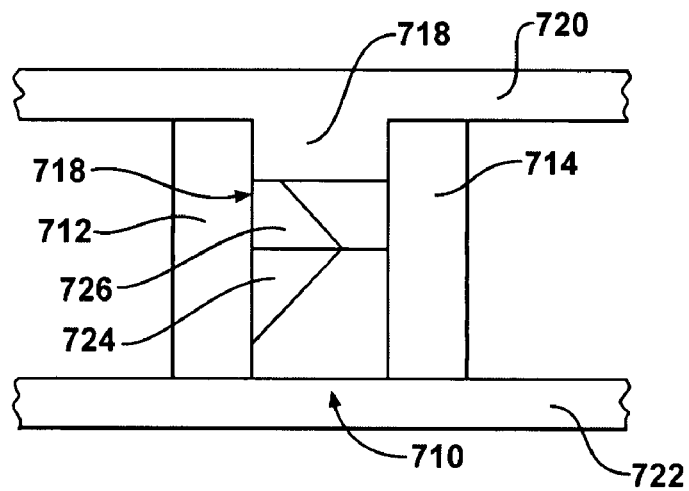

FIG. 7C illustrates an embodiment in which implant region 708 is formed in a heater 710 such as may be employed in conjunction with a phase change electronics device such as an OUM. In this illustrative embodiment, insulating sidewall spacers 712, 714 act as the shadowing structures in implants that yield a region 724 of the heater non-conductive and a region 726 of the phase change material 718 non-switching. In this illustrative embodiment an implant (using Tellurium, for example) in the other region of the phase change material 718 left that region more likely to switch. By stacking the implants in this manner, current is directed through the conductive area of the heater to the switching area of the phase change material, thereby employing the effects of both phase change and heater implants to reduce the programmed volume of the phase change material 718.

Figure 8:
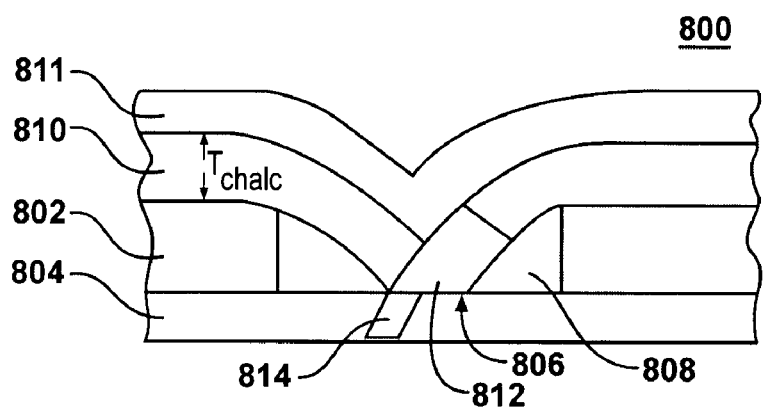
FIG. 8 is a cross sectional view of a phase change memory that employs phase change material as a shadowing device in an angled implantation to reduce the programmed volume of the memory.

As previously noted a shadowing structured employed in accordance with the principles of the present invention may be either a temporary or permanent part of the phase change memory. For example, in the illustrative embodiment of FIG. 8, the phase change material itself may be used as the shadowing structure. In this illustrative embodiment, a phase change electronics device 800 includes an insulating layer 802 formed atop a bottom electrode 804. A pore 806 is formed in the insulating layer 802 and sidewall spacers 808 diminish the volume of the interior of the pore 806 as previously described. A layer of phase change material 810, which substantially fills the pore 806, is formed on top of the insulating layer 802. A top electrode 811 lays on top of the phase change layer and, when the device 800 is selected, completes a conduction path between row and column address lines in a memory array of which the device 800 is a part. In this illustrative embodiment, an angled implant has been carried out and the implant has penetrated the thickness $T_{chalc}$ of the phase change layer. Because the implant was angled, a region 812 within the phase change material has not been implanted. In this illustrative embodiment, the implanted phase change material, that is the phase change material outside the volume 812, is "de-activated" by the implant and, therefore, the region 812, a fraction of the volume of the pore, is the only volume of phase change material in which switching may take place. That is, the programming volume is confined to the region 812 by the compositional changes to the phase change region outside the volume 812 brought on by the angled implant. In this illustrative embodiment the bottom electrode 804 has also been angle implanted, in a prior step, to form a region 814 of low conductivity which further confines the programmed volume of the device.

In an illustrative embodiment that employs chalcogenide as phase change material, the stoichiometry of the chalcogenide may be chosen to limit the amount of implantation that is necessary to achieve the goal of the implantation. That is, for example, in the case where the implantation is to de-activate the chalcogenide, a chalcogenide that is relatively sparse in tellurium may be chosen. With a tellurium-sparse composition that is already a somewhat less active switching material, relatively little de-activating implantation must be performed. Conversely, in an application where the implantation is to activate the chalcogenide, a chalcogenide that is relatively rich in tellurium may be chosen. With a tellurium-rich composition that is already a somewhat more active switching material, relatively little activating implantation (e.g. tellurium) must be performed.

Figure 9:
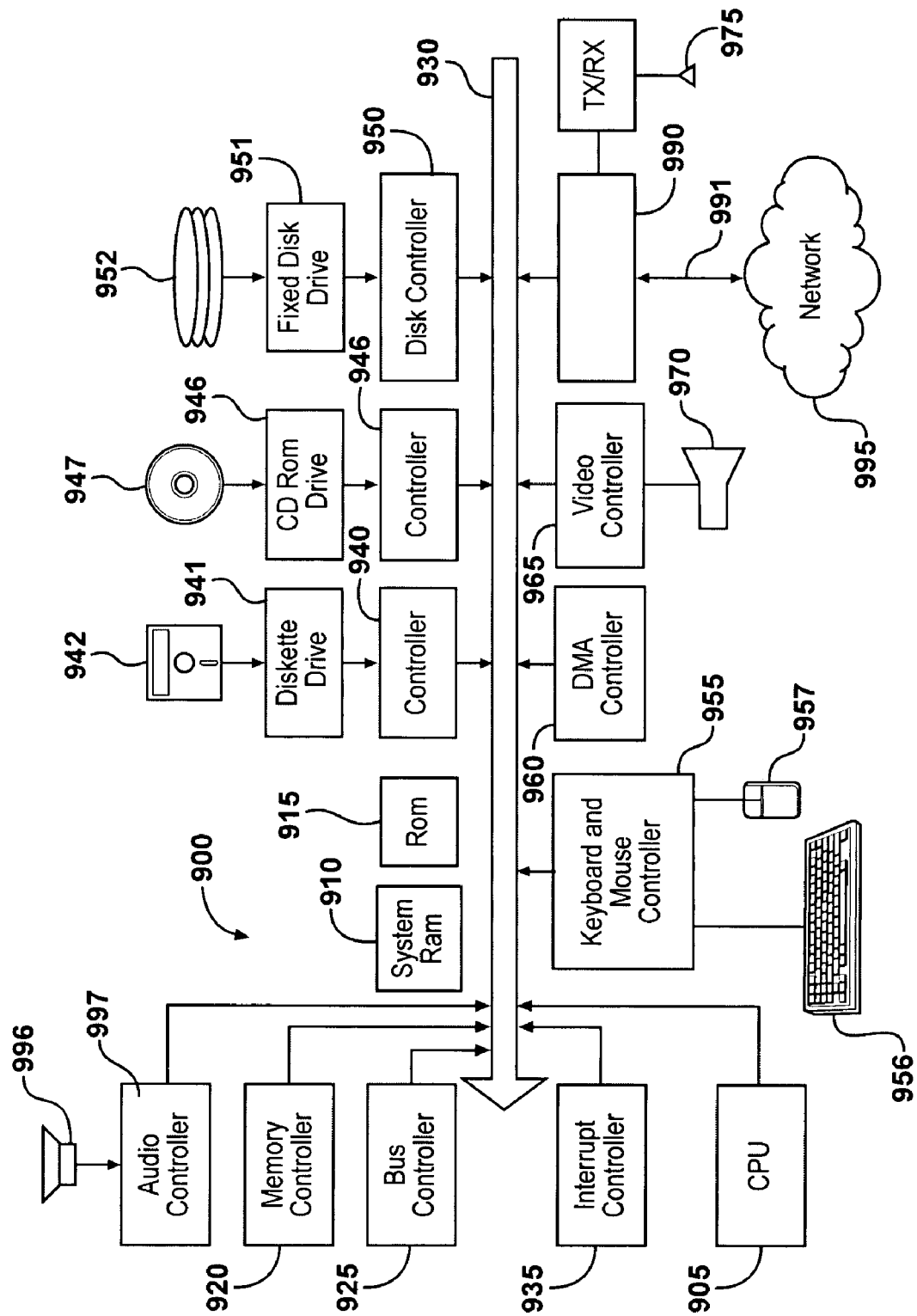
FIG. 9 is a block diagram of a system in accordance with the principles of the present invention that employs a phase change memory having a reduced programmed volume.

The phase change-based electronic device(s) described in the discussion related to the previous figures may be employed to particular advantage in a wide variety of systems. The schematic diagram of FIG. 9 will be employed to illustrate the devices' use in a few such systems. The schematic diagram of FIG. 9 includes many components and devices, some of which will be used for specific embodiments of a system in accordance with the principles of the present invention and others not. In other embodiments, other components and devices may be employed. The exemplary system of FIG. 9 is for descriptive purposes only. Although the description may refer to terms commonly used in describing particular computer, communications, tracking, and entertainment systems, the description and concepts equally apply to other systems, including systems having architectures dissimilar to that illustrated in FIG. 9. The electronic system 900, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, or a radio frequency identification device. Any or all of the components depicted in FIG. 9 may employ a phase change memory, such as a phase change-based nonvolatile memory or threshold switch, for example.

In an illustrative embodiment, the system 900 includes a central processing unit (CPU) 905, which may be implemented with a microprocessor, a random access memory (RAM) 910 for temporary storage of information, and a read only memory (ROM) 915 for permanent storage of information. A memory controller 920 is provided for controlling RAM 910. In accordance with the principles of the present invention, all of, or any portion of, any of the memory elements (e.g. RAM or ROM) may be implemented as phase change-based nonvolatile memory.

In an illustrative embodiment, an electronic system 900 in accordance with the principles of the present invention is a microprocessor that operates as a CPU 905, in combination with embedded phase change-based electronic nonvolatile memory that operates as RAM 910 and/or ROM 915. In this illustrative example, the microprocessor/phase change-nonvolatile memory combination may be standalone, or may operate with other components, such as those of FIG. 9 yet-to-be described.

In implementations within the scope of the invention, a bus 930 interconnects the components of the system 900. A bus controller 925 is provided for controlling bus 930. An interrupt controller 935 is used for receiving and processing various interrupt signals from the system components. Such components as the bus 930, bus controller 925, and interrupt controller 935 may be employed in a large-scale implementation of a system in accordance with the principles of the present invention, such as that of a standalone computer, a router, a portable computer, or a data storage system, for example.

Mass storage may be provided by diskette 942, CD ROM 947, or hard drive 952. Data and software may be exchanged with the system 900 via removable media such as diskette 942 and CD ROM 947. Diskette 942 is insertable into diskette drive 941 which is, in turn, connected to bus 930 by a controller 940. Similarly, CD ROM 947 is insertable into CD ROM drive 946 which is, in turn, connected to bus 930 by controller 945. Hard disc 952 is part of a fixed disc drive 951 which is connected to bus 930 by controller 950. Although conventional terms for storage devices (e.g., diskette) are being employed in this description of a system in accordance with the principles of the present invention, any or all of the storage devices may be implemented using phase change-based nonvolatile memory in accordance with the principles of the present invention. Removable storage may be provided by a nonvolatile storage component, such as a thumb drive, that employs a phase change-based nonvolatile memory in accordance with the principles of the present invention as the storage medium. Storage systems that employ phase change-based nonvolatile memory as "plug and play" substitutes for conventional removable memory, such as disks or CD ROMs, for example, may emulate existing controllers to provide a transparent interface for controllers such as controllers 940, 945, and 950, for example.

User input to the system 900 may be provided by any of a number of devices. For example, a keyboard 956 and mouse 957 are connected to bus 930 by controller 955. An audio transducer 996, which may act as both a microphone and a speaker, is connected to bus 930 by audio controller 997, as illustrated. Other input devices, such as a pen and/or tabloid may be connected to bus 930 and an appropriate controller and software, as required, for use as input devices. DMA controller 960 is provided for performing direct memory access to RAM 910, which, as previously described, may be implemented using phase change-based nonvolatile memory devices in accordance with the principles of the present invention. A visual display is generated by video controller 965 which controls display 970. The display 970 may be of any size or technology appropriate for a given application. In a cellular telephone or portable entertainment system embodiment, for example, the display 970 may include one or more relatively small (e.g. on the order of a few inches per side) LCD displays. In a large-scale data storage system, the display may implemented as large-scale multi-screen, liquid crystal displays (LCDs), or organic light emitting diodes (OLEDs), including quantum dot OLEDs, for example.

The system 900 may also include a communications adaptor 990 which allows the system to be interconnected to a local area network (LAN) or a wide area network (WAN), schematically illustrated by bus 991 and network 995. An input interface 999 operates in conjunction with an input device 993 to permit a user to send information, whether command and control, data, or other types of information, to the system 900. The input device and interface may be any of a number of common interface devices, such as a joystick, a touch-pad, a touch-screen, a speech-recognition device, or other known input device. In some embodiments of a system in accordance with the principles of the present invention, the adapter 990 may operate with transceiver 973 and antenna 975 to provide wireless communications, for example, in cellular telephone, RFID, and wifi computer implementations.

Operation of system 900 is generally controlled and coordinated by operating system software. The operating system controls allocation of system resources and performs tasks such as processing scheduling, memory management, networking, and I/O services, among things. In particular, an operating system resident in system memory and running on CPU 905 coordinates the operation of the other elements of the system 900.

In illustrative handheld electronic device embodiments of a system 900 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 955, keyboard 956 and mouse 957, for example. Embodiments with a transmitter, recording capability, etc., may also include a microphone input (not shown).

In an illustrative RFID transponder implementation of a system 900 in accordance with the principles of the present invention, the antenna 975 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 973 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a phase change-based nonvolatile memory in accordance with the principles of the present invention. In this illustrative embodiment, data read out from the memory is transferred to the transceiver 73 as an "answer-back" signal on the antenna 975 at a second carrier frequency $F_2$. In passive RFID systems power is derived from the interrogating signal and memory such as provided by a phase change-based nonvolatile memory in accordance with the principles of the present invention is particularly well suited to such use. A phase-change nonvolatile memory in accordance with the principles of the present invention may be used as a data storage element in any of these implementations, substituting for RAM, ROM, EPROM, or disk storage, for example.

I claim:
1. A phase change memory, comprising:
   a first electrode, said first electrode having a first region with a first composition and second region with a second composition; wherein said first composition in the first region is different from said second composition in the second region:
   a second electrode; and
   a phase change material disposed between and electrically coupled to said first and second electrodes, said phase- change material including a first portion in direct contact with said first region of said first electrode and a second portion in direct contact with said second region of said first electrode.

2. The phase change memory of claim 1, wherein said first region of said first electrode is more conductive than said second region of said first electrode.

3. The phase change memory of claim 1, wherein said first portion of said phase-change material has a greater tendency to crystallize than said second portion of said phase-change material.

4. The phase change memory of claim 1, wherein the composition of said first portion of said phase change material differs from the composition of said second portion of said phase-change material.

5. The phase change memory of claim 1, wherein the threshold voltage of said first portion of said phase-change material is lower than the threshold voltage of said second portion of said phase-change material.

6. The phase change memory of claim 1, wherein said first portion of said phase change material is less conductive than said second portion of said phase-change material.

7. The phase change memory of claim 2, wherein said first portion of said phase-change material has a greater tendency to crystallize than said second portion of said phase-change material.

8. The phase change memory of claim 2, wherein the composition of said first portion of said phase change material differs from the composition of said second portion of said phase-change material.

9. The phase change memory of claim 2, the threshold voltage of said first portion of said phase-change material is lower than the threshold voltage of said second portion of said phase-change material.

10. The phase change memory of claim 1, wherein said first portion of said phase-change material is crystalline and said second portion of said phase-change material is amorphous.

11. The phase change memory of claim 1, wherein said phase-change material further comprises a third portion in direct contact with said first region of said first electrode.

12. The phase change memory of claim 1, wherein said first electrode comprises a heater.

13. An electronic system comprising:
a controller; and
a phase change memory configured to store data for access by said controller, said phase change memory including;
a first electrode, said first electrode having a first region with a first composition and a second region with a second composition; a second electrode; phase change material disposed between and electrically coupled to said first and second electrodes, said phase-change material including a first portion in direct contact with said first region of said first electrode and a second portion in direct contact with said second region of said first electrode.

14. The electronic system of claim 13, wherein said system is a microcontroller.

15. The electronic system of claim 14, wherein said system is a portable electronic device.

16. The electronic system of claim 15, wherein said system is a cellular telephone.

17. The electronic system of claim 15, wherein said system is a handheld entertainment device.

18. The phase-change memory of claim 4, wherein said second portion of said phase-change material comprises the chemical elements present in said first portion of said phase-change material and further comprises at least one additional chemical element.

19. The phase-change memory of claim 18, wherein the at least one additional chemical element is selected from the group consisting of O, Si, As, P, and N.

20. The phase-change memory of claim 4, wherein said second portion of said phase-change material consists essentially of the chemical elements present in said first portion of said phase-change material, said second portion including the chemical elements in a different proportion than in said first portion.

21. The phase-change memory of claim 4, wherein said first portion of said phase-change material is in direct contact with said first electrode.

22. The phase-change memory of claim 21, wherein said second portion of said phase-change material is in direct contact with said second electrode.

23. The phase-change memory of claim 1, wherein said second region of said first electrode comprises the chemical elements present in said first region of said first electrode and further comprises at least one additional chemical element.

24. The phase change memory of claim 2, wherein said first portion of said phase-change material is crystalline and said second portion of said phase-change material is amorphous.

* * * * *